(12) United States Patent
Yeo et al.

(10) Patent No.: US 6,340,629 B1
(45) Date of Patent: Jan. 22, 2002

(54) METHOD FOR FORMING GATE ELECTRODES OF SEMICONDUCTOR DEVICE USING A SEPARATED WN LAYER

(75) Inventors: In Seok Yeo; Jean Hong Lee, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/466,752

(22) Filed: Dec. 17, 1999

(30) Foreign Application Priority Data

Dec. 22, 1998 (KR) .............................. 98-57228

(51) Int. Cl.$^7$ ................ H01L 21/3205; H01L 21/4763; H01L 21/44
(52) U.S. Cl. ........................ 438/592; 438/652; 438/653; 438/654; 438/655; 438/657
(58) Field of Search ........................ 438/592, 652–655, 438/657

(56) References Cited

U.S. PATENT DOCUMENTS

| | | | |
|---|---|---|---|
| 4,404,732 A | | 9/1983 | Andrade |
| 4,740,826 A | | 4/1988 | Chatterjee |
| 4,929,567 A | | 5/1990 | Park et al. |
| 5,071,788 A | | 12/1991 | Joshi |
| 5,112,765 A | | 5/1992 | Cederbaum et al. |
| 5,116,774 A | | 5/1992 | Huang et al. |
| 5,212,400 A | | 5/1993 | Joshi |
| 5,599,725 A | | 2/1997 | Dorleans et al. |
| 5,633,522 A | | 5/1997 | Dorleans et al. |
| 5,688,706 A | | 11/1997 | Tseng |
| 5,719,410 A | * | 2/1998 | Suehiro et al. |
| 5,789,312 A | | 8/1998 | Buchanan et al. |
| 5,858,867 A | | 1/1999 | Hsia et al. |
| 5,907,188 A | * | 5/1999 | Nakajima et al. |
| 6,096,640 A | * | 8/2000 | Hu |

FOREIGN PATENT DOCUMENTS

| | | |
|---|---|---|
| JP | 5530867 | 3/1980 |
| JP | 6015920 | 1/1985 |

(List continued on next page.)

OTHER PUBLICATIONS

Hiura et al., Integration technorology of Polymetal(W/WSiN/Poly–Si) dual gate CMOS for 1Gbit DRAMs and beyond, IEDM 98, p. 389–392.*
Galewski et al., "WNx/W as a low–resistance gate material and local interconnect", MAM 97, pp. 88–90.*
Lee et al., "In–situ barrier formation for high relaible W/barrier/Poly–Si gate using denudation of WNx of Polycrystalline Si", IEEE 98, pp. 385–388.*
Akasaka et al., "Low–resistivity poly–metal gate electrode durable fro high–temperature processing", IEEE 96, pp. 1864–1869.*

*Primary Examiner*—John F. Niebling
*Assistant Examiner*—Ron Pompey
(74) *Attorney, Agent, or Firm*—Selitto, Behr & Kim

(57) ABSTRACT

Disclosed is a method for forming gate electrodes using tungsten formed on a tungsten nitride layer by the chemical vapor deposition(CVD) process rather than the physical vapor deposition(PVD) process. According to the method for forming gate electrodes of the present invention, a silicon layer is formed as a conductive layer for gate electrodes. A tungsten nitride layer is formed on the silicon layer, and then the tungsten nitride layer is thermally treated thereby making a surface of the tungsten nitride layer a first tungsten layer. Next, a second tungsten layer is formed by using the first tungsten layer as a nucleation layer according to the CVD process. According to the present method for forming gate electrodes, tungsten can be deposited by the CVD process rather than by the PVD process. Therefore, those problems such as washing equipment and the particle source which are necessarily accompanied with the PVD process can be prevented, thereby improving productivity and yield.

6 Claims, 2 Drawing Sheets

FOREIGN PATENT DOCUMENTS

| | | |
|---|---|---|
| JP | 61241974 | 10/1986 |
| JP | 1125985 | 5/1989 |
| JP | 1175257 | 7/1989 |
| JP | 1187871 | 7/1989 |
| JP | 1207971 | 8/1989 |
| JP | 1207972 | 8/1989 |
| JP | 1207973 | 8/1989 |
| JP | 1251758 | 10/1989 |
| JP | 27552 | 1/1990 |
| JP | 226074 | 1/1990 |
| JP | 277162 | 3/1990 |
| JP | 2129917 | 5/1990 |
| JP | 4336468 | 11/1992 |
| JP | 7263680 | 10/1995 |
| JP | 10135452 | 5/1998 |

* cited by examiner

METHOD FOR FORMING GATE ELECTRODES OF SEMICONDUCTOR DEVICE USING A SEPARATED WN LAYER

BACKGROUND OF THE INVENTION

1. Field of the Invention

The present invention generally relates to a method for forming gate electrodes of semiconductor device, especially for gate electrodes of a semiconductor device, such as over 1 Gb DRAM(dynamic random access memory) that requires high integrity and high operation speed.

2. Description of the Related Art

The semiconductor memory device is generally divided into a read/write memory and a read-only-memory(ROM). The read/write memory is also divided into a DRAM and an SRAM(static random access memory). The DRAM is the most advanced device in point of integrity since one unit cell comprises one transistor and one capacitor.

In the meantime, 256 Mb DRAM has been developed since memory capacity was raised by four times in every three years due to fast development in the integrity, and also various studies on 1 Gb DRAM are in progress. As the DRAM is highly integrated, size of a cell reading electrical signals and writing is also reduced in proportion to the reduction in size. For example, the size of 1 Gb DRAM cell is approximately 0.8 $\mu m^2$. Accordingly, a required line width of a gate electrode corresponding to said size is reduced very much. As a result, a material for gate electrode such as a conventional polysilicon or a tungsten silicide WSix can not realize low resistance by means of fine line width which is required by the over 1 Gb DRAM.

Namely, up to now, a doped polysilicon has been used for the gate electrode of a semiconductor device, and a tungsten silicide is deposited on the polysilicon in order to lower the resistivity of the electrode. However, the resistivity of tho tungsten silicide thin film is approximately 100 $\mu\Omega\cdot cm$ which is still high, and further reduction in the resistivity of the gate electrode is required so as to obtain a device capable of driving in over 1 Gb DRAM with fine line width. Accordingly, there have been a number of studies on forming a word line by means of the tungsten whose resistivity is approximately 10 $\mu\Omega\cdot cm$.

Meanwhile, in order to form the tungsten on a lower polysilicon, there should be formed a tungsten nitride(WN) layer as a diffusion barrier layer so that a reaction between tungsten and polysilicon may be prevented. Now, tungsten can not be deposited on the tungsten nitride(WN) layer by the chemical vapor deposition(CVD) process, therefore the physical vapor deposition(PVD) process is used. According to the PVD process, however a thin film is deposited not only on the wafer but on other portions of a chamber. As thickness of the deposited thin film within the chamber is increased, they function as particle source. To remove the particle source, an equipment for the PVD process is disjointed into pieces, and then washed. However, this process increases downtime of equipment thereby lowering productivity and the yield is also lowered.

SUMMARY OF THE INVENTION

Accordingly, this invention is provided to solve foregoing problems. It is the object of the present invention to provide a method for forming gate electrodes of a high integration memory device that uses especially tungsten gate electrode formed on the tungsten nitride(WN) layer, not by the PVD process but by the CVD process.

The method for forming gate electrodes of a semiconductor device as provided above to accomplish the foregoing object, comprises the steps of: forming a gate insulating layer on a semiconductor substrate, a silicon layer on the gate insulating layer; forming a tungsten nitride(WN) layer on the silicon layer; forming a first tungsten layer at an upper portion of the tungsten nitride layer and a silicon tungsten nitride layer at a lower portion contacted with the silicon layer by thermally treating the tungsten nitride(WN) layer; and forming a second tungsten layer on the first tungsten layer by using the first tungsten layer as a nucleation layer according to a chemical vapor deposition process.

DETAILED DESCRIPTION OF THE INVENTION

Hereinafter, the present invention will be described in detail with reference to accompanying drawings.

FIGS. 1 to 4 are cross-sectional views illustrating a method for forming gate electrodes according to one embodiment of the present invention.

Figure 1:
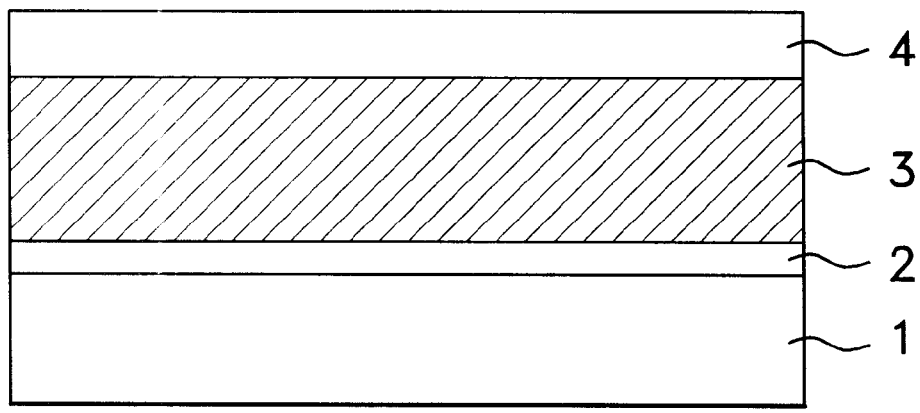
FIGS. 1 to 4 are cross-sectional views illustrating a method for forming gate electrodes according to one embodiment of the present invention.

Referring to FIG. 1, a gate insulating layer 2 is formed on a silicon substrate 1 and a doped silicon layer 3 is deposited thereon. And then, a tungsten nitride(WN) layer 4 as a diffusion barrier layer is formed on the silicon layer 3. The tungsten nitride(WN) layer 4 has a content of nitride of 5~20 atomic % preferably.

An SOI(silicon on insulator) substrate having a buried oxide layer can be used for the silicon substrate 1, or a silicon-epitaxial-wafer having epitaxial growth can be used for the silicon substrate 1. Besides the silicon substrate, another substrate of chemical compound or other semiconductor material is also applicable. The gate insulating layer 2 is made of a thermal oxide layer, or an oxide- or a nitride-deposited dielectric layer. The doped silicon layer 3 is made of a polycrystalline silicon, an amorphous silicon or a deposition layer of the polycrystalline silicon and the amorphous silicon, and its thickness is selected in the range of 500~1000 Å. The tungsten nitride layer 4 is deposited with thickness of 50~300 Å according to the CVD or the PVD method.

Figure 2:
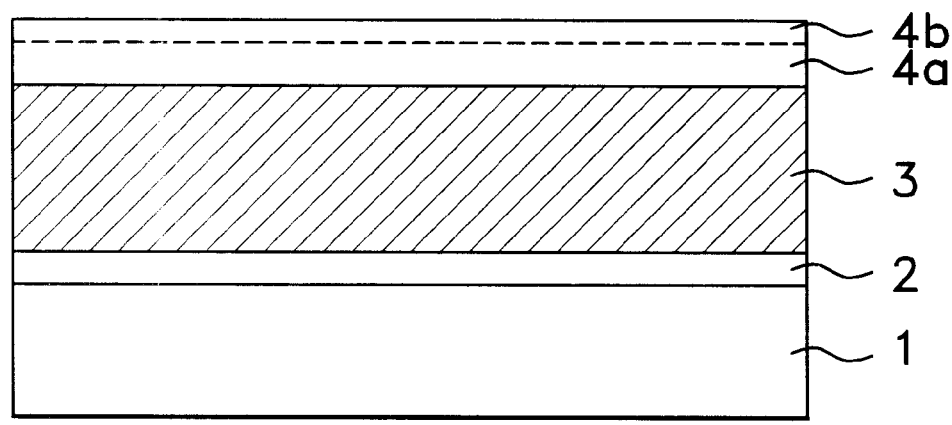

Next, referring to FIG. 2, the tungsten nitride layer 4 is thermally treated thereby changing its structure into a deposition structure of a tungsten silicon nitride(WSiN) layer 4a and a tungsten layer 4b. When the tungsten nitride layer 4 is thermally treated, a tungsten silicon nitride layer 4a is formed at a lower portion of the tungsten nitride layer 4 that is in contact with the silicon layer 3, and a first tungsten layer 4b is formed at an upper portion of the tungsten nitride layer 4 by diffusing nitride into the outside. The tungsten silicon nitride layer 4a as formed above, acts like a diffusion barrier for preventing a reaction between the first tungsten layer 4b, a second tungsten layer to be deposited later by the CVD process and the lower silicon layer. The first tungsten layer 4b serves as a nucleation layer for the second tungsten layer that is deposited later by the CVD process so as to make possible a tungsten deposition according to the CVD process. Meanwhile, the tungsten silicon nitride layer 4a is thermally treated by a furnace or a rapid thermal process (RTP) under inert gas, such as N or Ar atmosphere at a temperature of 600~1000° C.

Figure 3:
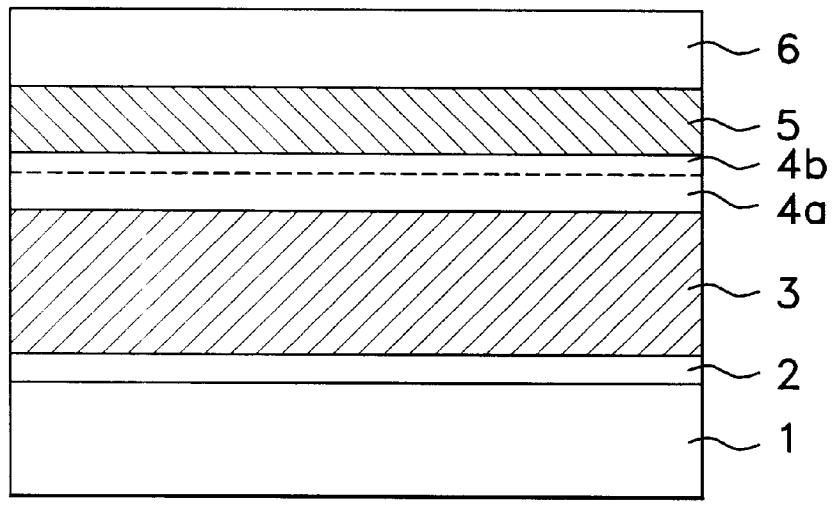

Next, referring to FIG. 3, the second tungsten layer 5 and an insulating layer 6 for mask are deposited in series by the CVD process. The second tungsten layer 5 has a thickness of 500~1000 Å. The insulating layer 6 is made of $SiO_2$, $Si_3N_4$, $SiO_4$ or a thin film in which said materials are deposited and the insulating layer 6 acts as a mask during a subsequent dry etching process.

Figure 4:
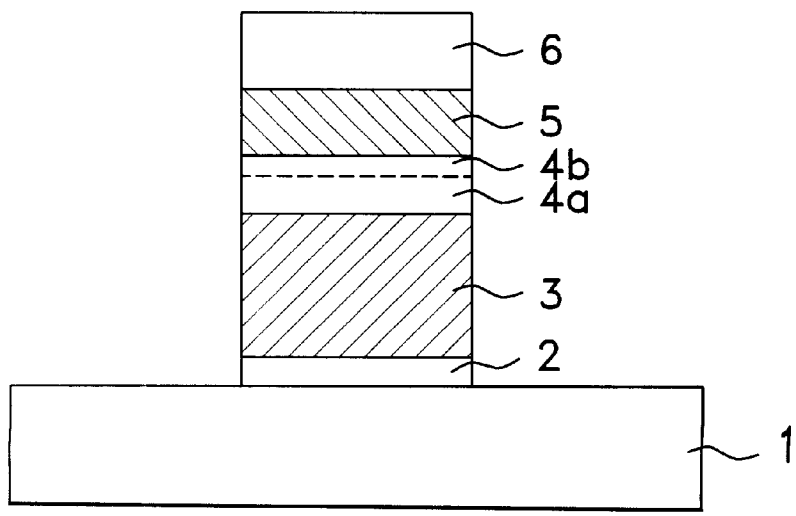

Afterward, referring to FIG. 4, a gate pattern is formed by etching the thin film deposited on the first silicon substrate 1 according to the gate mask process and the etching process. The process for forming mask insulating layer may be omissible if it is not a necessary condition.

According to the present method for forming gate electrodes, tungsten can be deposited by the CVD process rather than by the PVD process. Therefore, those problems such as washing equipment and the particle source which are necessarily accompanied with the PVD process can be prevented, thereby improving productivity and yield.

While the present invention has been described with reference to certain preferred embodiment, various other modifications will be apparent to and can be readily made by those skilled in the art without departing from the scope and spirit of the present invention.

What is claimed is:

1. A method for forming gate electrodes of semiconductor device comprising the steps of:

forming a gate insulating layer on a semiconductor substrate and a silicon layer on the gate insulating layer;

forming a tungsten nitride(WN) layer on the silicon layer;

forming a first tungsten layer at an upper portion of the tungsten nitride layer and a silicon tungsten nitride layer at a lower portion of the tungsten nitride layer by thermally treating the tungsten nitride layer; and forming a second tungsten layer on the first tungsten layer by using the first tungsten layer as a nucleation layer according to a chemical vapor deposition(CVD) process.

2. The method of claim 1, wherein the silicon layer is a doped polysilicon layer or a doped amorphous silicon layer, having thickness of 500~1500 Å.

3. The method of claim 1, wherein the tungsten nitride layer is formed with thickness of 50~300 Å according to the chemical vapor deposition(CVD) process or a physical vapor deposition(PVD) process.

4. The method of claim 1, wherein the silicon tungsten nitride layer is thermally treated by a furnace or a rapid thermal process(RTP) under inert gas atmosphere at temperature of 600~1000° C.

5. The method of claim 1, wherein the second tungsten layer is formed with thickness of 500~1000 Å.

6. The method of claim 1, wherein the tungsten nitride layer has a content of nitride of 5~20 atomic %.

* * * * *